(12) United States Patent
Motoyama (10) Patent No.: US 12,191,835 B2
(45) Date of Patent: Jan. 7, 2025

(54) LC FILTER

(71) Applicant: Murata Manufacturing Co., Ltd., Nagaokakyo (JP)

(72) Inventor: Hiroto Motoyama, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 273 days.

(21) Appl. No.: 17/970,648

(22) Filed: Oct. 21, 2022

(65) Prior Publication Data

US 2023/0044859 A1 Feb. 9, 2023

Related U.S. Application Data

(63) Continuation of application No. PCT/JP2021/017900, filed on May 11, 2021.

(30) Foreign Application Priority Data

May 25, 2020 (JP) ................. 2020-090711

(51) Int. Cl.
*H03H 7/00* (2006.01)
*H03H 1/00* (2006.01)
(Continued)

(52) U.S. Cl.
CPC ................ *H03H 7/03* (2013.01); *H03H 1/00* (2013.01); *H03H 7/0138* (2013.01);
(Continued)

(58) Field of Classification Search
CPC .......... H03H 7/0115; H03H 7/00; H03H 7/01; H03H 7/0138; H03H 7/0161; H03H 7/1741; H03H 7/03; H01F 2017/0026
(Continued)

(56) References Cited

U.S. PATENT DOCUMENTS 11,817,843 B2* 11/2023 Motoyama ........... H03H 7/1758
2007/0241839 A1 10/2007 Taniguchi
(Continued)

FOREIGN PATENT DOCUMENTS

JP  2000165171 A  6/2000
JP  2010074825 A  4/2010
(Continued)

OTHER PUBLICATIONS

International Search Report in PCT/JP2021/017900, mailed Jul. 20, 2021, 3 pages.
(Continued)

*Primary Examiner* — Hai L Nguyen
(74) *Attorney, Agent, or Firm* — Keating & Bennett, LLP (57) ABSTRACT

An LC filter includes an input terminal, an output terminal, a multilayer body, plate electrodes, connection electrodes connecting the plate electrodes, capacitor electrodes, and a inductor vias. Each of the capacitor electrodes opposes the plate electrode. One end of an inductor via is connected with the input terminal with a capacitor electrode interposed therebetween. Another end of the inductor via is connected to an intermediate point of a connection electrode. An inductor via is connected between the plate electrode and a capacitor electrode. An inductor via is connected between the plate electrode and a capacitor electrode. One end of an inductor via is connected with the output terminal with a capacitor electrode interposed therebetween. Another end of the inductor via is connected to an intermediate point of a connection electrode.

16 Claims, 9 Drawing Sheets

(51) Int. Cl.
    *H03H 7/01*         (2006.01)
    *H03H 7/03*         (2006.01)
(52) U.S. Cl.
    CPC ........ *H03H 7/0161* (2013.01); *H03H 7/1741*
                  (2013.01); *H03H 2001/0085* (2013.01)
(58) Field of Classification Search
    USPC ................................ 333/167, 175, 184, 185
    See application file for complete search history.

(56)                References Cited

U.S. PATENT DOCUMENTS

2010/0045405 A1   2/2010  Shimamura et al.
    2011/0133860 A1   6/2011  Fukamachi et al.
    2019/0007018 A1   1/2019  Ashida et al.
    2019/0305745 A1  10/2019  Taniguchi

FOREIGN PATENT DOCUMENTS

JP        2014027690 A     2/2014
    JP        2019012977 A     1/2019
    WO        2007119356 A1   10/2007
    WO        2010018798 A1    2/2010
    WO        2018100923 A1    6/2018

OTHER PUBLICATIONS

Written Opinion in PCT/JP2021/017900, mailed Jul. 20, 2021, 5 pages.

\* cited by examiner

LC FILTER

CROSS REFERENCE TO RELATED APPLICATIONS

This application claims the benefit of priority to Japanese Patent Application No. 2020-090711, filed on May 25, 2020, and is a Continuation Application of PCT Application No. PCT/JP2021/017900, filed on May 11, 2021. The entire contents of each application are hereby incorporated herein by reference.

BACKGROUND OF THE INVENTION

1. Field of the Invention

The present disclosure relates to LC filters, and more particularly, to techniques for improving characteristics of a multilayered LC filter.

2. Description of the Related Art

Japanese Unexamined Patent Application Publication No. 2000-165171 discloses an LC filter including multiple stages of resonators composed of inductors and capacitors formed in a multilayer substrate. The LC filter disclosed in Japanese Unexamined Patent Application Publication No. 2000-165171 achieves desired filter characteristics by means of magnetic coupling and/or capacitive coupling between the resonator of each stage and adjacent other resonators.

LC filters of the type described above can be used in portable communication devices represented by mobile phones or smartphones. For such portable terminals, there is still high need for miniaturization and lower thickness, and in turn miniaturization of electronic components for mounting inside of them is also required.

For an LC filter having multiple stages of resonators such as the one disclosed in Japanese Unexamined Patent Application Publication No. 2000-165171, it is known that attenuation characteristics in non-pass bands can be improved by increasing the number of resonator stages. However, increase in the number of resonators formed in a multilayer body leads to stronger coupling between the resonators and there can be a situation where signals in the non-pass bands cannot be sufficiently attenuated, although filter loss is decreased.

SUMMARY OF THE INVENTION

Preferred embodiments of the present invention improve attenuation characteristics of a multi-stage, multilayered LC filter while reducing or preventing an increase in filter loss.

An LC filter according to a preferred embodiment of the present invention includes an input terminal, an output terminal, a multilayer body including a plurality of dielectric layers, a first electrode, a second electrode, connection electrodes connecting the first electrode and the second electrode, a first capacitor electrode, a second capacitor electrode, a third capacitor electrode, a fourth capacitor electrode, a first inductor via, a second inductor via, a third inductor via, and a fourth inductor via. The first electrode and the second electrode are provided on different dielectric layers from each other in the multilayer body. The first capacitor electrode, the second capacitor electrode, the third capacitor electrode, and the fourth capacitor electrode each oppose the second electrode. The first capacitor electrode is connected with the first inductor via. The second capacitor electrode is connected with the second inductor via. The third capacitor electrode is connected with the third inductor via. The fourth capacitor electrode is connected with the fourth inductor via. One end of the first inductor via is connected with the input terminal with the first capacitor electrode interposed therebetween. Another end of the first inductor via is connected at a position on one of the connection electrodes between the first electrode and the second electrode. The second inductor via is connected between the first electrode and the second capacitor electrode. The third inductor via is connected between the first electrode and the third capacitor electrode. One end of the fourth inductor via is connected with the output terminal with the fourth capacitor electrode interposed therebetween. The other end of the fourth inductor via is connected at a position on one of the connection electrodes between the first electrode and the second electrode.

In the LC filters according to preferred embodiments of the present invention, among the resonance circuits in a multi-stage configuration defining each of the filters, resonance circuits that are connected to the input and output terminals are directly connected with connection electrodes that connect the first electrode and the second electrode. This weakens magnetic coupling by the resonance circuits connected to the input and output terminals. Accordingly, the attenuation characteristics are able to be improved while reducing or preventing increase in filter loss.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present disclosure are described in detail below with reference to the drawings. In the drawings, the same or equivalent portions are denoted with the same reference characters and descriptions of them are not repeated.

First Preferred Embodiment

Filter Configuration

Figure 1:
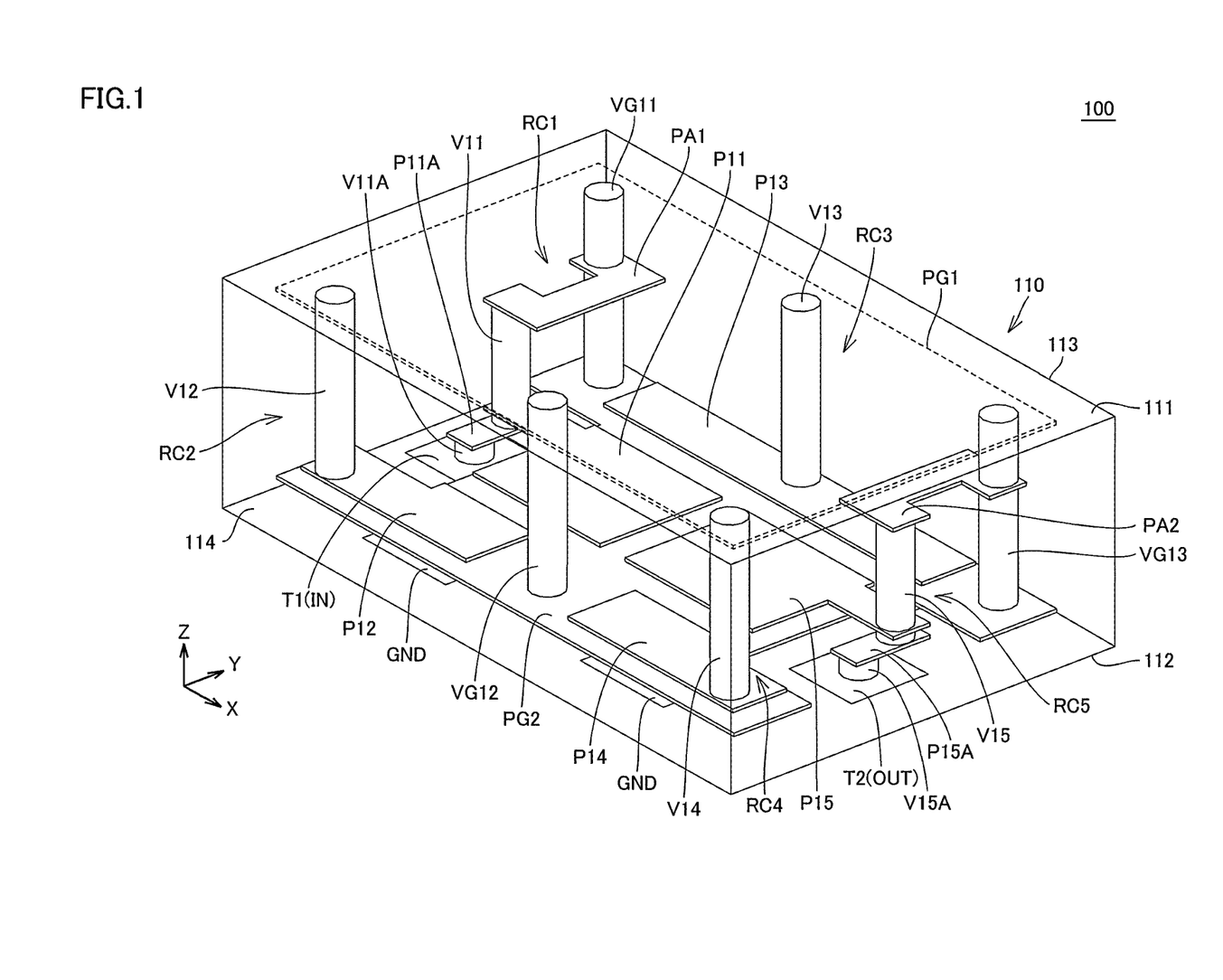
FIG. 1 is a perspective transparent view of an LC filter according to a first preferred embodiment of the present invention.
Figure 2:
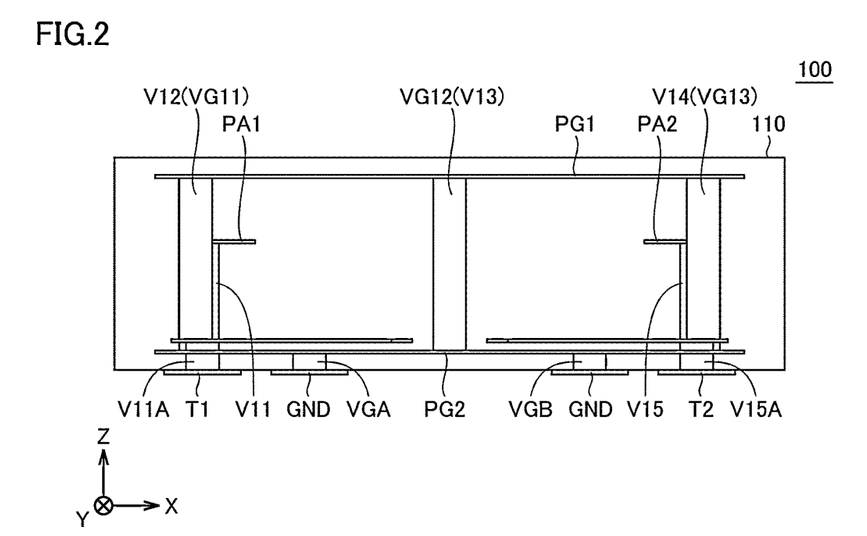
FIG. 2 is a side transparent view of the LC filter of FIG. 1.

With FIGS. 1 and 2, the configuration of an LC filter 100 according to a first preferred embodiment of the present invention is described. FIG. 1 is a perspective transparent view of the LC filter 100. FIG. 2 is a side transparent view of the LC filter 100. The LC filter 100 preferably includes a multilayer body 110 of a rectangular parallelepiped or substantially rectangular parallelepiped shape in which multiple dielectric layers are layered in a layering direction. The dielectric layers of the multilayer body 110 are preferably made of ceramic, for example. On the inside of the multilayer body 110, inductors and capacitors are defined by multiple wiring patterns and electrodes provided on the respective dielectric layers, and by multiple vias provided between the dielectric layers. LC resonance circuits are defined by these inductors and capacitors.

In the description that follows, the layering direction of the multilayer body 110 will be referred to as "Z-axis direction", the direction perpendicular or substantially perpendicular to the Z-axis direction and oriented along the longer sides of the multilayer body 110 will be referred to as "X-axis direction", and the direction oriented along the shorter sides of the multilayer body 110 will be referred to as "Y-axis direction". Also, the positive direction on the Z axis in drawings may be referred to as the upper side and the negative direction on the Z axis in drawings may be referred to as the lower side below.

In FIG. 1 and FIGS. 4, 9, and 11, to be discussed later, dielectric in the multilayer body 110 is not illustrated, showing only the conductors of wiring patterns, vias, and terminals provided inside.

FIG. 2 is a side transparent view of the LC filter 100 as seen from the Y-axis negative direction in FIG. 1. Referring to FIGS. 1 and 2, the multilayer body 110 includes an upper surface 111 and a lower surface 112. On the lower surface 112 of the multilayer body 110, an input terminal T1, an output terminal T2, and ground terminals GND are preferably provided. The input terminal T1, the output terminal T2, and the ground terminals GND are external terminals to connect the LC filter 100 to external devices and are plate-shaped electrodes. Specifically, the input terminal T1, the output terminal T2, and the ground terminals GND are preferably land grid array (LGA) terminals regularly arranged on the lower surface 112 of the multilayer body 110.

A plate electrode PG2 is provided on a dielectric layer adjacent to the lower surface 112 of the multilayer body 110. As shown in FIG. 2, the plate electrode PG2 is connected to the ground terminals GND with vias VGA, VGB interposed therebetween. A plate electrode PG1 is provided on a dielectric layer adjacent to the upper surface 111 of the multilayer body 110. In FIG. 1, the plate electrode PG1 is shown by a broken line.

The plate electrode PG1 and the plate electrode PG2 are connected with each other by ground vias VG11, VG12, VG13, which extend in the layering direction of the multilayer body 110. The ground vias VG11, VG13 are preferably located along a side surface 113 (a first side surface) in the Y-axis positive direction of the multilayer body 110. The ground via VG11 is located at the corner in the X-axis negative direction and the ground via VG13 is located at the corner in the X-axis positive direction. The ground via VG12 is provided substantially at the center in the X-axis direction along a side surface 114 (a second side surface) in the negative direction of the multilayer body 110. The side surface 113 and the side surface 114 are opposite each other.

On a dielectric layer between the plate electrode PG1 and the plate electrode PG2, multiple plate-shaped electrodes P11 to P15 are provided. These multiple electrodes P11 to P15 are spaced apart from the plate electrode PG2 and each define a capacitor between itself and the plate electrode PG2. In the following, the electrodes P11 to P15 will also be referred to as "capacitor electrodes". The capacitor electrodes P11 to P15 are spaced apart from each other and are capacitively coupled with each other. The capacitor electrodes P11 to P15 are respectively connected with inductor vias V11 to V15, which define LC resonance circuits.

The input terminal T1 is connected with the capacitor electrode P11 with a via V11A and a wiring electrode P11A interposed therebetween. One end of the inductor via V11 is connected with the capacitor electrode P11 and the other end is connected with a wiring electrode PA1. The wiring electrode PA1 is provided on a dielectric layer between the plate electrode PG1 and the capacitor electrode P11 and connects the inductor via V11 with the ground via VG11. That is, the other end of the inductor via V11 is connected at a position in the ground via VG11 between the plate electrode PG1 and the plate electrode PG2 by the wiring electrode PA1. Such a configuration causes the inductor via V11 and the capacitor electrode P11 to define an LC resonance circuit (a first resonance circuit RC1) directly connected with the ground via VG11.

The output terminal T2 is connected with the capacitor electrode P15 with a via V15A and a wiring electrode P15A interposed therebetween. One end of the inductor via V15 is connected with the capacitor electrode P15 and the other end is connected with a wiring electrode PA2. The wiring electrode PA2 is provided on a dielectric layer between the plate electrode PG1 and the capacitor electrode P15 and connects the inductor via V15 with the ground via VG13. That is, the other end of the inductor via V15 is connected at a position in the ground via VG13 between the plate electrode PG1 and the plate electrode PG2 by the wiring electrode PA2. Such a configuration causes the inductor via V15 and the capacitor electrode P15 to define an LC resonance circuit (a fifth resonance circuit RC5) directly connected with the ground via VG13.

The inductor via V12 is located at the corner in the X-axis negative direction along the side surface 114. The inductor via V12 is connected with the plate electrode PG1 and the capacitor electrode P12 and defines an LC resonance circuit (a second resonance circuit RC2).

The inductor via V13 is located near the center on the X axis along the side surface 113. That is, the inductor via V13 is located between the ground via VG11 and the ground via VG13 along the side surface 113. The inductor via V13 is connected with the plate electrode PG1 and the capacitor electrode P13 and defines an LC resonance circuit (a third resonance circuit RC3).

The inductor via V14 is located at the corner in the X-axis positive direction along the side surface 114. The inductor via V14 is connected with the plate electrode PG1 and the capacitor electrode P14 and defines an LC resonance circuit (a fourth resonance circuit RC4).

In this manner, the LC filter 100 includes a configuration including multiple resonance circuits adjacent each other and functions as a band pass filter by an attenuation pole that is created by magnetic coupling and/or capacitive coupling of the adjacent resonance circuits with each other. A high frequency signal supplied to the input terminal T1 passes through the first resonance circuit RC1, the second resonance circuit RC2, the third resonance circuit RC3, the fourth resonance circuit RC4, and the fifth resonance circuit RC5 to be output from the output terminal T2.

Figure 3:
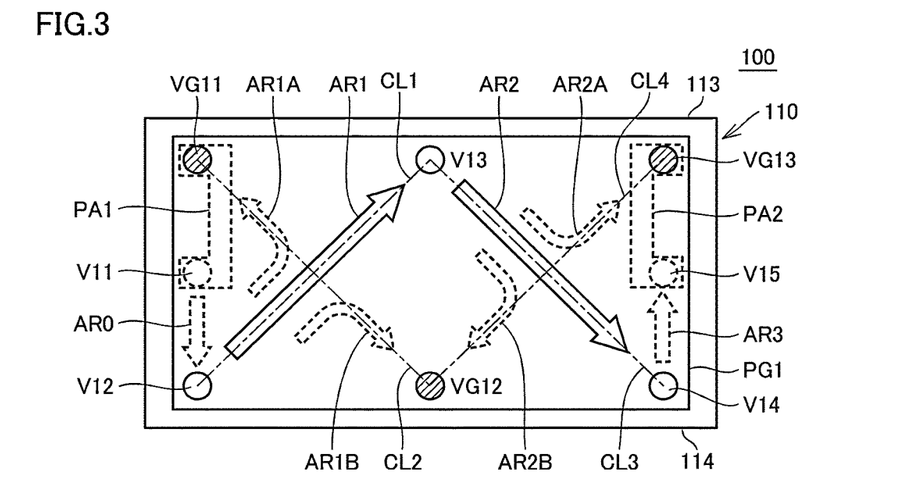
FIG. 3 is a plan view describing a transfer path of a signal (current) on a plate electrode PG1 of the LC filter of FIG. 1.

FIG. 3 is a plan view describing a transfer path of a signal (current) on the plate electrode PG1 of the LC filter 100 of FIG. 1. Referring to FIG. 3, a high frequency signal supplied to the input terminal T1 is transferred from the first resonance circuit RC1 to the adjacent second resonance circuit RC2 through magnetic coupling as indicated by arrow AR0. After being transferred to the second resonance circuit RC2, the signal is transferred to the adjacent third resonance circuit RC3 through the plate electrode PG1 as indicated by arrow AR1, and further to the fourth resonance circuit RC4 neighboring the third resonance circuit RC3 as indicated by arrow AR2 (arrow AR2). Then, after being transferred to the fourth resonance circuit RC4, the signal is transferred to the fifth resonance circuit RC5 through magnetic coupling as indicated by arrow AR3, to be output from the output terminal T2.

Here, in transferring a signal between the resonance circuits, it is important to increase the degree of coupling between the resonance circuits to enhance the Q value from the viewpoint of reducing signal loss in a desired pass band. At the same time, for a filter device, it is preferred that signals in the non-pass bands are not transferred as much as possible. That is to say, from the viewpoint of attenuating signals in the non-pass bands, reducing the degree of coupling between the resonance circuits is also required.

Thus, in order to prevent the degree of coupling between the resonance circuits from being too high, the LC filter 100 of the first preferred embodiment is configured such that the first resonance circuit RC1 and the fifth resonance circuit RC5, which are the resonance circuits connected to the input and output terminals, are connected with the ground vias VG11, VG13 by the wiring electrodes PA1, PA2. More specifically, as shown in FIG. 1 and other drawings, the inductor vias V11, V15 in the first resonance circuit RC1 and the fifth resonance circuit RC5 are not directly connected with the plate electrode PG1 like the other resonance circuits, but are connected with the plate electrodes PG1, PG2 by the ground vias VG11, VG13 with the wiring electrodes PA1, PA2 interposed therebetween, respectively. By adopting such a configuration, the degree of coupling between the first resonance circuit RC1 and the second resonance circuit RC2 and the degree of coupling between the fourth resonance circuit RC4 and the fifth resonance circuit RC5 can be reduced as compared to when the first resonance circuit RC1 and the fifth resonance circuit RC5 are directly connected with the plate electrode PG1.

In general, it is known that with a multi-stage LC filter, the Q values of resonance circuits positioned in middle stages significantly contribute to the Q value of the entire filter device and the Q values of resonance circuits closer to end portions (the input and output terminals) have relatively small impact on the Q value of the entire filter. Accordingly, by building a circuit such that the resonance circuits connected with the input and output terminals are connected to the ground vias as mentioned above, the degree of coupling between the resonance circuits can be prevented from being too high while maintaining the Q value of the entire filter.

In addition, in the LC filter 100 of the first preferred embodiment, the ground vias VG11, VG12, VG13 are located on both sides of the signal transfer path (arrows AR1, AR2) between the inductor vias V12, V13, V14 on the plate electrode PG1 when the multilayer body 110 is viewed in plan from the layering direction (Z-axis direction), as shown in FIG. 3. Specifically, an imaginary line CL1 (a first imaginary line) connecting the inductor via V12 and the inductor via V13 intersects with an imaginary line CL2 (a second imaginary line) connecting the ground via VG11 and the ground via VG12. Similarly, an imaginary line CL3 connecting the inductor via V13 and the inductor via V14 intersects with an imaginary line CL4 connecting the ground via VG12 and the ground via VG13.

In order to achieve symmetry of characteristics in the filter, it is preferable that the inductor vias and the ground vias are positioned symmetrically or substantially symmetrically so that the imaginary line CL1 and the imaginary line CL2 intersect with each other at the midpoint and the imaginary line CL3 and the imaginary line CL4 intersect with each other at the midpoint.

Such an arrangement of vias causes a portion of the signal (current) being transferred from the inductor via V12 to the inductor via V13 to leak to the ground vias VG11, VG12 on the plate electrode PG1, as indicated by arrows AR1A, AR1B. Similarly, part of the signal (current) being transferred from the inductor via V13 to the inductor via V14 leaks to the ground vias VG12, VG13 as indicated by arrows AR2A, AR2B. This slightly reduces the degree of coupling between the second resonance circuit RC2 and the third resonance circuit RC3 and the degree of coupling between the third resonance circuit RC3 and the fourth resonance circuit RC4.

The "plate electrode PG1" and "plate electrode PG2" in the first preferred embodiment correspond to the "first electrode" and "second electrode", respectively. The "ground vias VG11 to VG13" in the first preferred embodiment correspond to the "first ground via" to "third ground via", respectively, and collectively correspond to the "connection electrodes". The "capacitor electrode P11", "capacitor electrode P12", "capacitor electrode P13", "capacitor electrode P15", and "capacitor electrode P14" in the first preferred embodiment correspond to the "first capacitor electrode" to "fifth capacitor electrode", respectively. The "inductor via V11", "inductor via V12", "inductor via V13", "inductor via V15", and "inductor via V14" in the first preferred embodiment correspond to the "first inductor via" to "fifth inductor via", respectively.

Filter Characteristics

Next, the bandpass characteristics of the LC filter 100 in the first preferred embodiment are described in comparison with a case of a comparative example.

Figure 4:
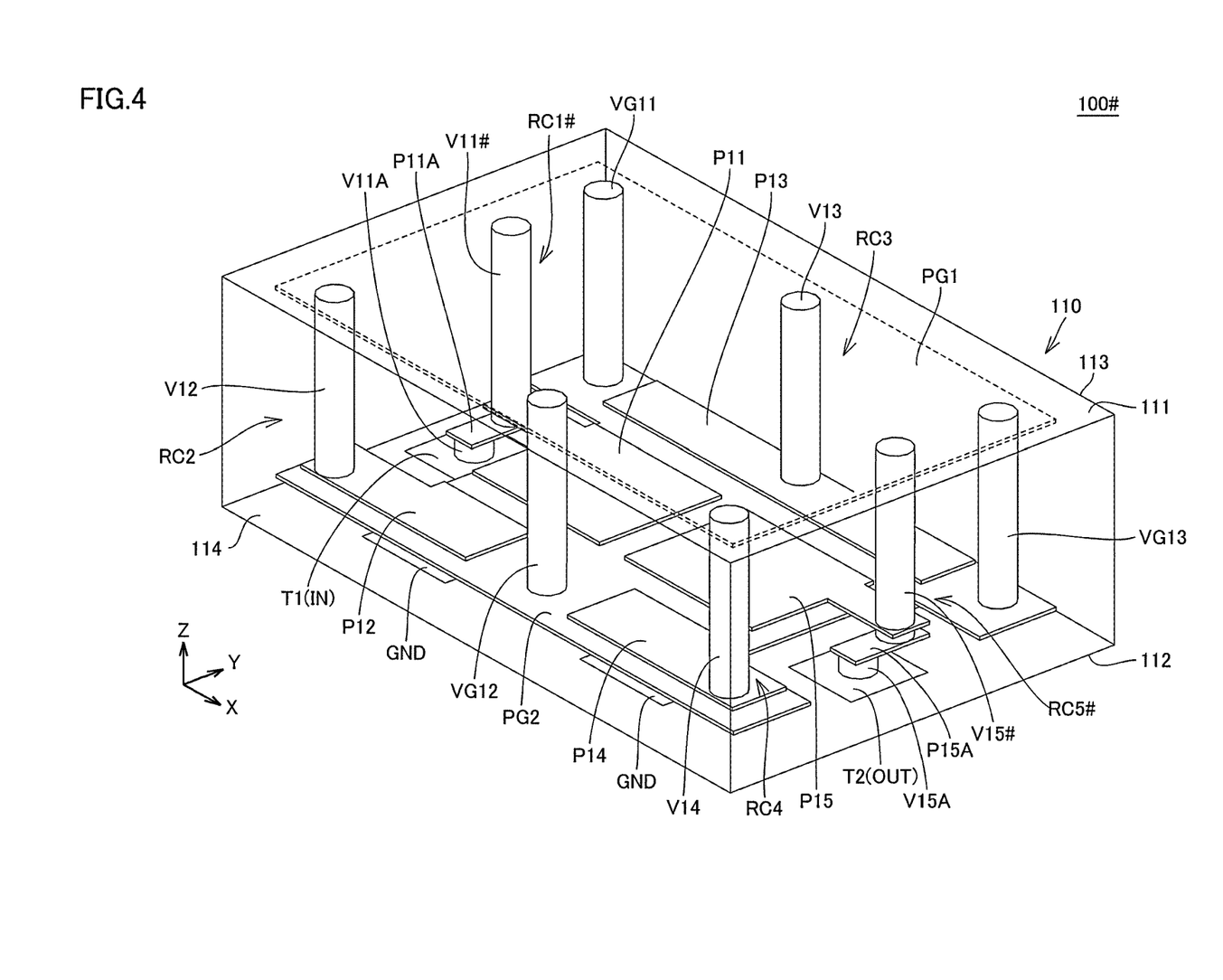
FIG. 4 is a perspective transparent view of an LC filter as a comparative example.

FIG. 4 is a perspective transparent view of an LC filter 100 # as a comparative example. The LC filter 100 # as a comparative example is configured such that the first resonance circuit RC1 connected with the input terminal T1 and the fifth resonance circuit RC5 connected with the output terminal T2 in the LC filter 100 of the first preferred embodiment are replaced by a first resonance circuit RC1 # and a fifth resonance circuit RC5 #, respectively.

Specifically, in the first resonance circuit RC1 # in the comparative example, the wiring electrode PA1 in the first preferred embodiment is not included. Then, an inductor via V11 # is connected with the plate electrode PG1 and the capacitor electrode P11. Similarly, in the fifth resonance circuit RC5 #, the wiring electrode PA2 in the first preferred embodiment is not included and an inductor via V15 # is connected with the plate electrode PG1 and the capacitor electrode P15. That is, the first resonance circuit RC1 # and the fifth resonance circuit RC5 # are configured such that they are directly connected with the plate electrode PG1.

Figure 5:
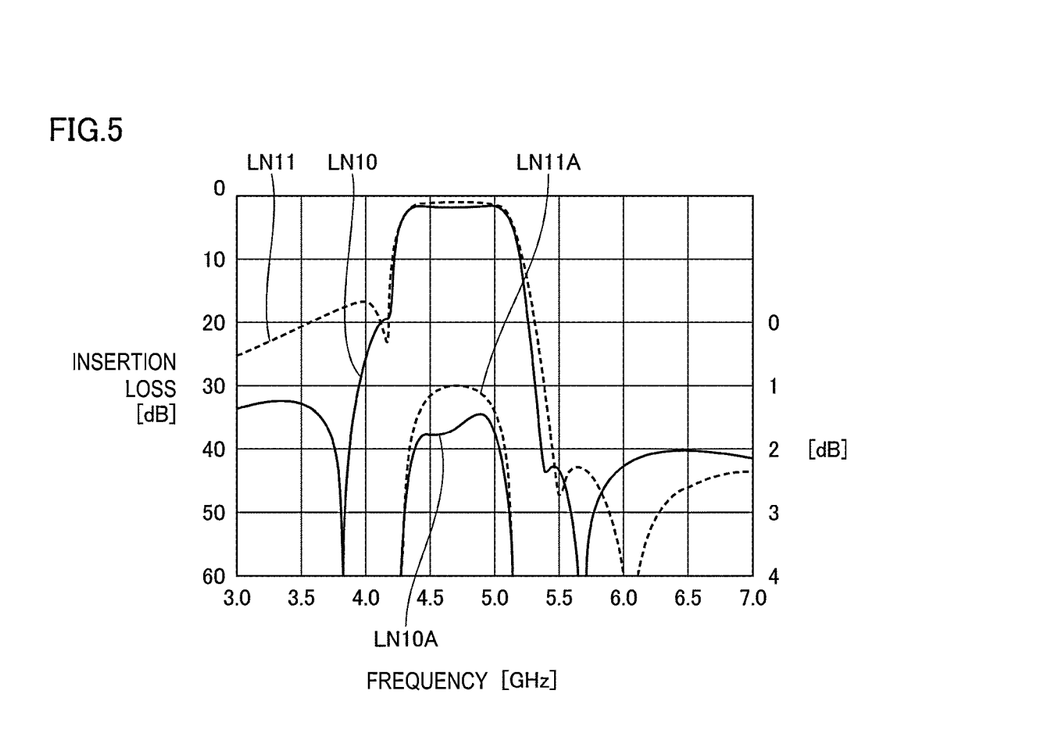
FIG. 5 is a diagram describing the bandpass characteristics of the LC filters in the first preferred embodiment of the present invention and the comparative example.

FIG. 5 is a diagram describing the bandpass characteristics of the LC filter 100 in the first preferred embodiment and those of the LC filter 100 # in the comparative example. In FIG. 5, frequency is indicated on the horizontal axis and insertion loss from the input terminal T1 to the output terminal T2 is indicated on the vertical axis. In FIG. 5, solid lines LN10, LN10A indicate the case of the LC filter 100 of the first preferred embodiment, while broken lines LN11, LN11A indicate the case of the LC filter 100 # as a comparative example. Note that the solid line LN10A and the broken line LN11A are enlarged illustrations of the vertical axes of the solid line LN10 and the broken line LN11 (the scale on the right axis). Here, the specification of the pass band of the LC filters is 4400 MHz to 5000 MHz.

Referring to FIG. 5, for the insertion loss in the pass band, the LC filter 100 in the first preferred embodiment has greater insertion loss than the LC filter 100 # in the comparative example in terms of peak value, as indicated by the solid line LN10A and the broken line LN11A. This is because the degree of coupling is reduced in the first preferred embodiment as a result of a configuration in which the first resonance circuit RC1 and the fifth resonance circuit RC5 are directly connected with the ground vias as mentioned above. However, for a frequency bandwidth with an insertion loss of 3 dB or less, the two filters have achieved comparable bandwidths.

For the attenuation characteristics, for the low frequency side of the pass band, the first preferred embodiment has achieved an attenuation of up to about 60 dB as opposed to the attenuation of about 25 dB of the comparative example. For the high frequency side of the pass band, the attenuations of the two filters are comparable but the first preferred embodiment has achieved a steeper attenuation.

In this manner, the LC filter 100 of the first preferred embodiment can improve the attenuation characteristics in the non-pass bands while reducing or preventing increase in the filter loss in the pass band by adopting a configuration in which the resonance circuits connected to the input and output terminals are directly connected with the ground vias.

Modifications

The first preferred embodiment described an example of an LC filter configuration having five stages of resonance circuits. In first to third modifications below, examples of LC filters having different numbers of stages of resonance circuits will be described.

First Modification

Figure 6:
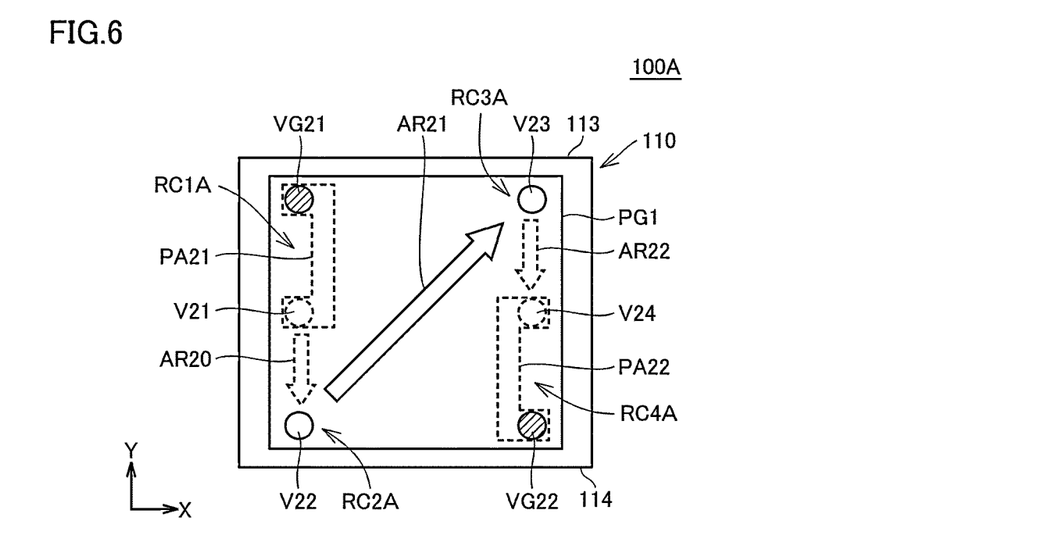
FIG. 6 is a plan view of an LC filter of a first modification of a preferred embodiment of the present invention.

FIG. 6 is a plan view of an LC filter 100A of a first modification of a preferred embodiment of the present invention. The LC filter 100A preferably includes four stages of resonance circuits. More specifically, the LC filter 100A includes a first resonance circuit RC1A including an inductor via V21 and a wiring electrode PA21, a second resonance circuit RC2A including an inductor via V22, a third resonance circuit RC3A including an inductor via V23, and a fourth resonance circuit RC4A including an inductor via V24 and a wiring electrode PA22. Although not shown in FIG. 6, each inductor via is connected with a capacitor electrode as in the LC filter 100 of the first preferred embodiment.

When the multilayer body 110 is viewed in plan in the layering direction, the inductor vias V22, V23 are located at the corners on one of the diagonal lines of the plate electrode PG1 on the rectangle. Ground vias VG21, VG22 are located at the corners on the other diagonal line of the plate electrode PG1. In other words, the ground via VG21 and the inductor via V23 are located along the side surface 113 of the multilayer body 110. The ground via VG22 and the inductor via V22 are located along the side surface 114 of the multilayer body 110. The inductor vias V22, V23 and the ground vias VG21, VG22 are positioned so that the imaginary line connecting the inductor vias V22, V23 intersects with the imaginary line connecting the ground vias VG21, VG22.

The inductor via V21 is located between the ground via VG21 and the inductor via V22. One end of the inductor via V21 is connected with the input terminal with a capacitor electrode interposed therebetween. Another end of the inductor via V21 is connected at an intermediate position on the ground via VG21 (a position between the plate electrode PG1 and the plate electrode PG2) with the wiring electrode PA21 interposed therebetween. That is, the first resonance circuit RC1A is configured such that it is directly connected with the ground via.

The inductor via V24 is located between the ground via VG22 and the inductor via V23. One end of the inductor via V24 is connected with the output terminal with a capacitor electrode interposed therebetween. The other end of the inductor via V24 is connected at an intermediate position on the ground via VG22 (a position between the plate electrode PG1 and the plate electrode PG2) with the wiring electrode PA22 interposed therebetween. That is, the fourth resonance circuit RC4A is configured such that it is directly connected with the ground via.

A high frequency signal supplied to the input terminal is transferred from the first resonance circuit RC1A to the second resonance circuit RC2A through magnetic coupling as indicated by arrow AR20. After being transferred to the second resonance circuit RC2A, the signal is transferred to the third resonance circuit RC3A through the plate electrode PG1 as indicated by arrow AR21, and further to the fourth resonance circuit RC4A through magnetic coupling as indicated by arrow AR22, to be output from the output terminal.

The LC filter 100A is configured such that the first resonance circuit RC1A connected to the input terminal and the fourth resonance circuit RC4A connected to the output terminal are directly connected with the ground vias. Further, the ground vias VG21, VG22 are located on both sides of the transfer path of a signal (current) from the second resonance circuit RC2A to the third resonance circuit RC3A on the plate electrode PG1. By adopting such a configuration, the degree of coupling between the resonance circuits is reduced while reducing or preventing decrease in the Q value of the entire filter in the LC filter 100A of the first modification as well, as in the first preferred embodiment. Accordingly, the attenuation characteristics can be improved while reducing or preventing decrease in the insertion loss of the filter.

The "ground vias VG21, VG22" in the first modification correspond to the "first ground via" and "second ground via" of the present disclosure, respectively, and collectively correspond to the "connection electrodes". The "inductor vias V21 to V24" in the first modification correspond to the "first inductor via" to "fourth inductor via", respectively.

Second Modification

Figure 7:
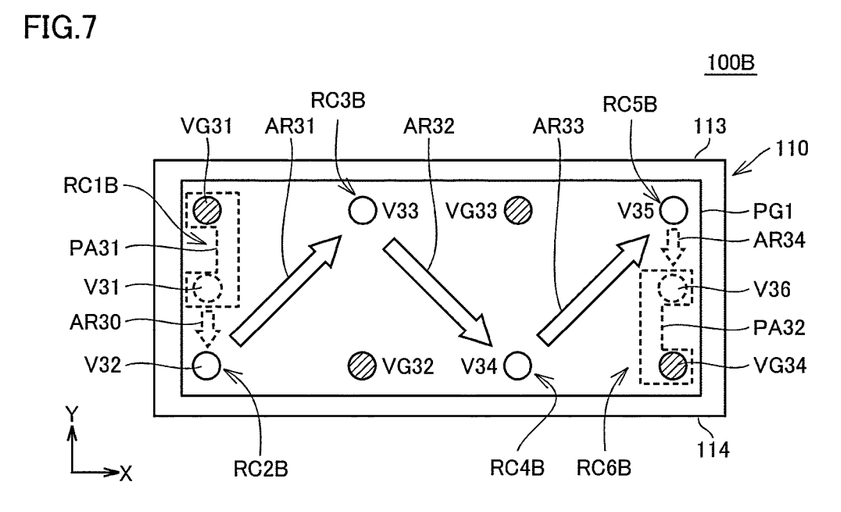
FIG. 7 is a plan view of a second modification of an LC filter according to a preferred embodiment of the present invention.

FIG. 7 is a plan view of an LC filter 100B of a second modification of a preferred embodiment of the present invention. The LC filter 100B preferably includes a configuration equivalent to the configuration of the LC filter 100 according to the first preferred embodiment plus an additional stage of a resonance circuit, that is, six stages of resonance circuits.

More specifically, the LC filter 100B includes a first resonance circuit RC1B including an inductor via V31 and a wiring electrode PA31, a second resonance circuit RC2B including an inductor via V32, a third resonance circuit RC3B including an inductor via V33, a fourth resonance circuit RC4B including an inductor via V34, a fifth resonance circuit RC5B including an inductor via V35, and a sixth resonance circuit RC6B including an inductor via V36 and a wiring electrode PA32. Although not shown in FIG. 7, each inductor via is connected with a capacitor electrode.

When the multilayer body 110 is viewed in plan from the layering direction, ground vias VG31, VG33 and the inductor vias V33, V35 are located in the order of the ground via VG31, the inductor via V33, the ground via VG33, and the inductor via V35 in the X-axis positive direction along the side surface 113 of the multilayer body 110. Ground vias VG32, VG34 and the inductor vias V32, V34 are located in the order of the inductor via V32, the ground via VG32, the inductor via V34, and the ground via VG34 in the X-axis positive direction along the side surface 114 of the multilayer body 110.

The first resonance circuit RC1B is configured such that it is directly connected at an intermediate position on the ground via VG31 by the wiring electrode PA31. The sixth resonance circuit RC6B is configured such that it is directly connected at an intermediate position on the ground via VG34 by the wiring electrode PA32.

A high frequency signal supplied to the input terminal is transferred in the order of the first resonance circuit RC1B, the second resonance circuit RC2B, the third resonance circuit RC3B, the fourth resonance circuit RC4B, the fifth resonance circuit RC5B, and the sixth resonance circuit RC6B as indicated by arrows AR30 to AR34 in FIG. 7, to be output from the output terminal. The ground vias VG31 to VG34 are located on both sides of the signal transfer path (arrows AR31 to AR33) on the plate electrode PG1.

The LC filter 100B is configured such that the first resonance circuit RC1B connected to the input terminal and the sixth resonance circuit RC6B connected to the output terminal are directly connected with the ground vias. Further, on the plate electrode PG1, the ground vias are located on both sides of the signal transfer path between the adjacent resonance circuits. By adopting such a configuration, the degree of coupling between the resonance circuits is reduced while reducing or preventing decrease in the Q value of the entire filter in the LC filter 100B of the second modification as well. Accordingly, the attenuation characteristics can be improved while reducing or preventing decrease in the insertion loss of the filter.

The "ground vias VG31 to VG33" in the second modification correspond to the "first ground via" to "third ground via", respectively. The "ground vias VG31 to VG34" in the second modification collectively correspond to the "connection electrodes". The "inductor via V31", "inductor via V32", "inductor via V33", "inductor via V36", and "inductor via V34" in the second modification correspond to the "first inductor via" to "fifth inductor via", respectively.

Third Modification

Figure 8:
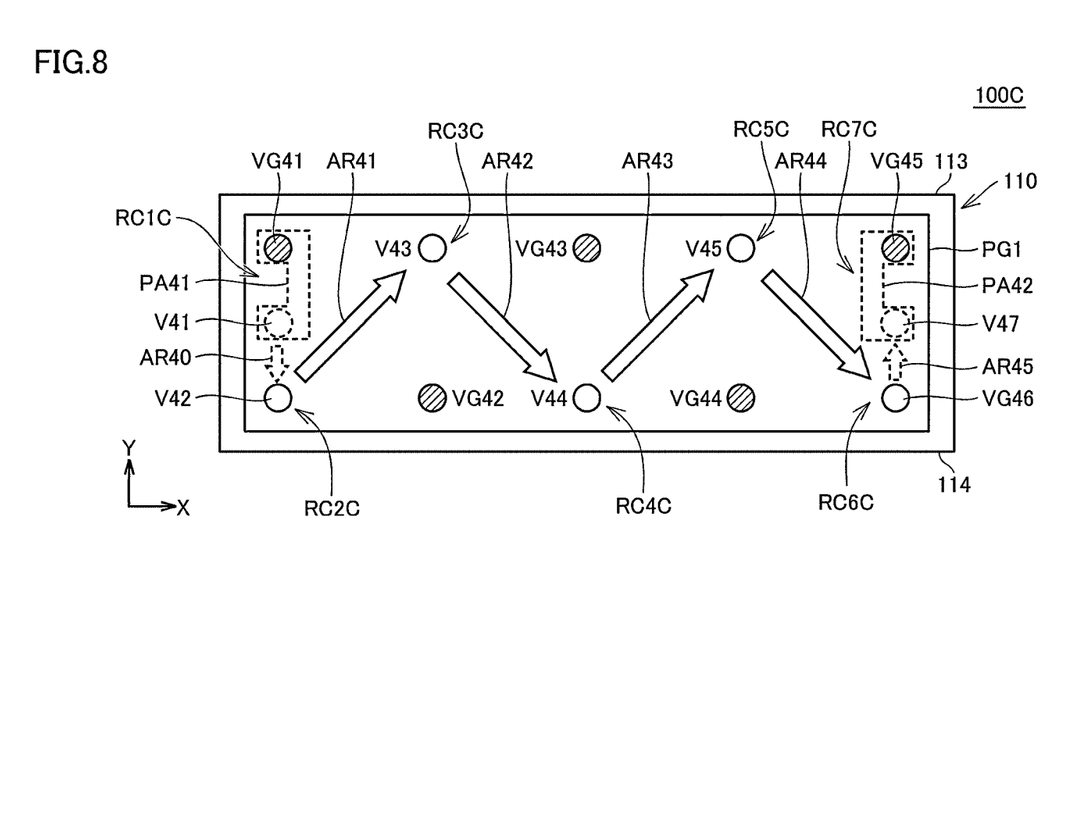
FIG. 8 is a plan view of an LC filter of a third modification of a preferred embodiment of the present invention.

FIG. 8 is a plan view of an LC filter 100C of a third modification of a preferred embodiment of the present invention. The LC filter 100C preferably includes a configuration equivalent to the configuration of the LC filter 100B of the second modification plus an additional stage of a resonance circuit, that is, seven stages of resonance circuits.

More specifically, the LC filter 100C includes a first resonance circuit RC1C including an inductor via V41 and a wiring electrode PA41, a second resonance circuit RC2C including an inductor via V42, a third resonance circuit RC3C including an inductor via V43, a fourth resonance circuit RC4C including an inductor via V44, a fifth resonance circuit RC5C including an inductor via V45, a sixth resonance circuit RC6C including an inductor via V46, and a seventh resonance circuit RC7C including an inductor via V47 and a wiring electrode PA42. Although not shown in FIG. 8, each inductor via is connected with a capacitor electrode.

When the multilayer body 110 is viewed in plan from the layering direction, ground vias VG41, VG43, VG45 and the inductor vias V43, V45 are located in the order of the ground via VG41, the inductor via V43, the ground via VG43, the inductor via V45, and the ground via VG45 in the X-axis positive direction along the side surface 113 of the multilayer body 110. Ground vias VG42, VG44 and the inductor vias V42, V44, V46 are located in the order of the inductor via V42, the ground via VG42, the inductor via V44, the ground via VG44, and the inductor via V46 in the X-axis positive direction along the side surface 114 of the multilayer body 110.

The first resonance circuit RC1C is configured such that it is directly connected at an intermediate position on the ground via VG41 by the wiring electrode PA41. The seventh resonance circuit RC7C is configured such that it is directly connected at an intermediate position on the ground via VG45 by the wiring electrode PA42.

A high frequency signal supplied to the input terminal is transferred in the order of the first resonance circuit RC1C, the second resonance circuit RC2C, the third resonance circuit RC3C, the fourth resonance circuit RC4C, the fifth resonance circuit RC5C, the sixth resonance circuit RC6C, and the seventh resonance circuit RC7C as indicated by arrows AR40 to AR45 in FIG. 8, to be output from the output terminal. The ground vias VG41 to VG45 are located on both sides of the signal transfer path (arrows AR41 to AR44) on the plate electrode PG1.

The LC filter 100C is configured such that the first resonance circuit RC1C connected to the input terminal and the seventh resonance circuit RC7C connected to the output terminal are directly connected with the ground vias. Further, on the plate electrode PG1, the ground vias are located on both sides of the signal transfer path between the adjacent resonance circuits. By adopting such a configuration, the degree of coupling between the resonance circuits is reduced while reducing or preventing decrease in the Q value of the entire filter in the LC filter 100C of the third modification as well. Accordingly, the attenuation characteristics can be improved while reducing or preventing decrease in the insertion loss of the filter.

The "ground vias VG41 to VG43" in the third modification correspond to the "first ground via" to "third ground via" of the present disclosure, respectively. The "ground vias VG41 to VG45" in the third modification collectively correspond to the "connection electrodes". The "inductor via V41", "inductor via V42", "inductor via V46", and "inductor via V47" in the third modification correspond to the "first inductor via" to "fourth inductor via", respectively.

While the first preferred embodiment and the modifications above described examples of LC filters having four to seven stages of resonance circuits, similar configurations can be applied in LC filters having an even higher number of stages.

Second Preferred Embodiment

In a second preferred embodiment of the present invention, an example of an LC filter configuration with a different arrangement of the inductor vias and the ground vias is described.

Figure 9:
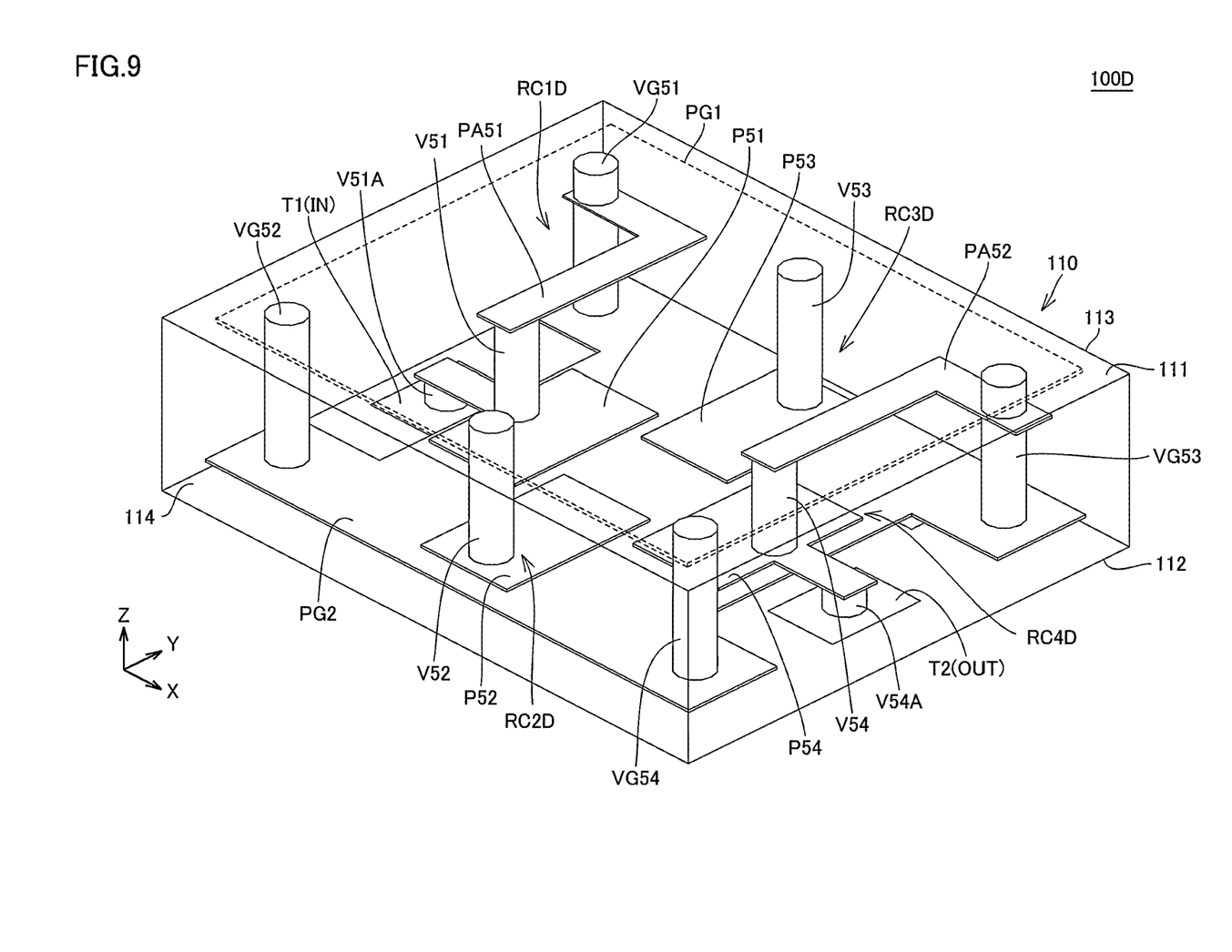
FIG. 9 is a perspective transparent view of an LC filter according to a second preferred embodiment of the present invention.
Figure 10:
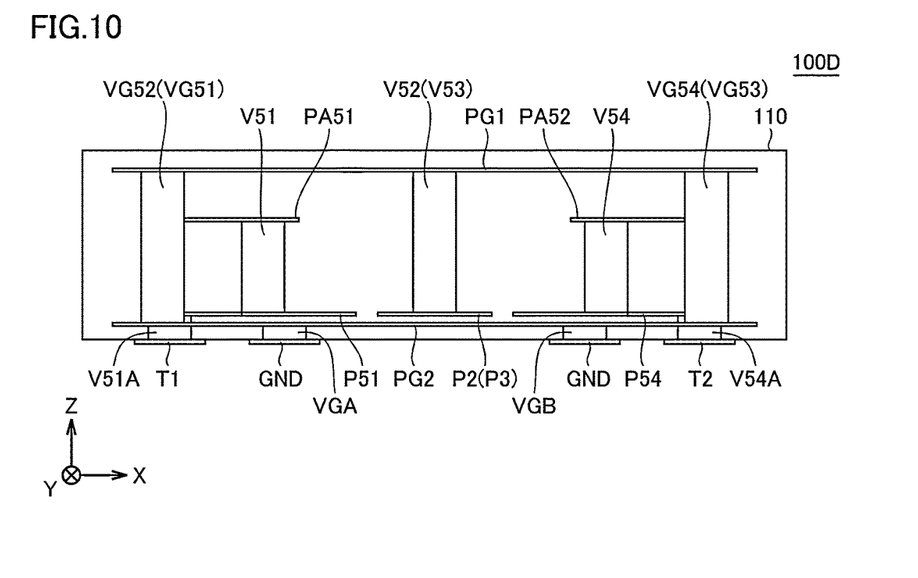
FIG. 10 is a side transparent view of the LC filter of FIG. 9.

FIG. 9 is a perspective transparent view of an LC filter 100D according to the second preferred embodiment. FIG. 10 is a side transparent view of the LC filter 100D as seen from the side surface 114 of the multilayer body 110. The LC filter 100D preferably includes a configuration with four stages of resonance circuits, as with the first modification in the first preferred embodiment described above.

Referring to FIGS. 9 and 10, the LC filter 100D includes the plate electrodes PG1, PG2, the input terminal T1 and the output terminal T2, inductor vias V51 to V54, ground vias VG51 to VG54, capacitor electrodes P51 to P54, and wiring electrodes PA51, PA52, provided in the multilayer body 110.

As with the LC filter 100 of the first preferred embodiment, the plate electrode PG1 is provided on a dielectric layer adjacent to the upper surface 111 of the multilayer body 110 and the plate electrode PG2 is provided on a dielectric layer adjacent to the lower surface 112. The plate electrode PG2 is connected to the ground terminal GND provided on the lower surface 112 with the vias VGA, VGB interposed therebetween.

The ground vias VG51 to VG54 are located at the four corners of the multilayer body 110 when the multilayer body 110 is viewed in plan from the layering direction (Z-axis direction). Specifically, the ground vias VG51, VG53 are located in the order of the ground via VG51 and the ground via VG53 in the X-axis direction along the side surface 113 of the multilayer body 110. Also, the ground vias VG52, VG54 are located in the order of the ground via VG52 and the ground via VG54 in the X-axis direction along the side surface 114 of the multilayer body 110. The ground vias VG51 to VG54 each connect the plate electrode PG1 and the plate electrode PG2.

On a dielectric layer between the plate electrode PG1 and the plate electrode PG2, the capacitor electrodes P51 to P54, which are plate-shaped, are provided. The capacitor electrodes P51 to P54 are spaced apart from the plate electrode PG2 and each form a capacitor between itself and the plate electrode PG2.

The capacitor electrodes P52, P53 are spaced apart from each other along the Y axis near the center in the X-axis direction when the multilayer body 110 is viewed in plan from the layering direction. The capacitor electrodes P52, P53 are connected with the inductor vias V52, V53, respectively, with one end of each of the inductor vias V52, V53 being connected with the plate electrode PG1. The inductor via V52 is located between the ground via VG52 and the ground via VG54 along the side surface 114 of the multilayer body 110. The inductor via V53 is located between the ground via VG51 and the ground via VG53 along the side surface 113 of the multilayer body 110. An LC resonance circuit (a second resonance circuit RC2D) is defined by the inductor via V52 and the capacitor electrode P52. An LC resonance circuit (a third resonance circuit RC3D) is defined by the inductor via V53 and the capacitor electrode P53.

The capacitor electrodes P51, P54 are spaced apart from each other along the X axis near the center in the Y-axis direction when the multilayer body 110 is viewed in plan from the layering direction. Portions of capacitor electrodes P52, P53 are positioned between the capacitor electrode P51 and the capacitor electrode P54.

The capacitor electrode P51 is connected to the input terminal T1 provided on the lower surface 112 of the multilayer body 110 with a via V51A interposed therebetween. The capacitor electrode P51 is connected with one end of the inductor via V51. The other end of the inductor via V51 is connected with the wiring electrode PA51. The wiring electrode PA51 is provided on a dielectric layer between the plate electrode PG1 and the plate electrode PG2. The inductor via V51 is connected at an intermediate position on the ground via VG51 (a position between the plate electrode PG1 and the plate electrode PG2) by the wiring electrode PA51. An LC resonance circuit (a first resonance circuit RC1D) directly connected with the ground via is defined by the inductor via V51, the wiring electrode PA51, and the capacitor electrode P51.

The capacitor electrode P54 is connected to the output terminal T2 provided on the lower surface 112 of the multilayer body 110 with a via V54A interposed therebetween. The capacitor electrode P54 is connected with one end of the inductor via V54. Another end of the inductor via V54 is connected with the wiring electrode PA52. The wiring electrode PA52 is provided on a dielectric layer between the plate electrode PG1 and the plate electrode PG2. The inductor via V54 is connected at an intermediate position on the ground via VG53 (a position between the plate electrode PG1 and the plate electrode PG2) by the wiring electrode PA52. An LC resonance circuit (a fourth resonance circuit RC4D) directly connected with the ground via is defined by the inductor via V54, the wiring electrode PA52, and the capacitor electrode P54.

In this manner, the LC filter 100D has a configuration including multiple resonance circuits adjacent each other and functions as a band pass filter by means of an attenuation pole that is created by magnetic coupling and/or capacitive coupling of the adjacent resonance circuits with each other. A high frequency signal supplied to the input terminal T1 passes through the first resonance circuit RC1D, the second resonance circuit RC2D, the third resonance circuit RC3D, and the fourth resonance circuit RC4D to be output from the output terminal T2.

The LC filter 100D is configured such that the first resonance circuit RC1D and the fourth resonance circuit RC4D which are connected to the input and output terminals are directly connected with the ground vias in the multiple stages of resonance circuits. Further, on the plate electrode PG1, an imaginary line connecting the inductor via V52 and the inductor via V53 intersects with an imaginary line connecting the ground via VG51 and the ground via VG54 or an imaginary line connecting the ground via VG52 and the ground via VG53. With such a configuration, the degree of coupling between the resonance circuits is reduced while reducing or preventing decrease in the Q value of the entire filter as described in the first preferred embodiment. Accordingly, the attenuation characteristics can be improved while reducing or preventing decrease in the insertion loss of the filter.

The "ground vias VG51 to VG54" in the second preferred embodiment correspond to the "first ground via", "second ground via", "fifth ground via", and "sixth ground via" of the present disclosure, respectively, and collectively correspond to the "connection electrodes". The "capacitor electrodes P51 to P54" in the second preferred embodiment correspond to the "first capacitor electrode" to "fourth capacitor electrode", respectively. The "inductor vias V51 to V54" in the second preferred embodiment correspond to the "first inductor via" to "fourth inductor via", respectively.

Third Preferred Embodiment

In a third preferred embodiment of the present invention, another configuration example of the connection between the plate electrode PG1 and the plate electrode PG2 is described.

Figure 11:
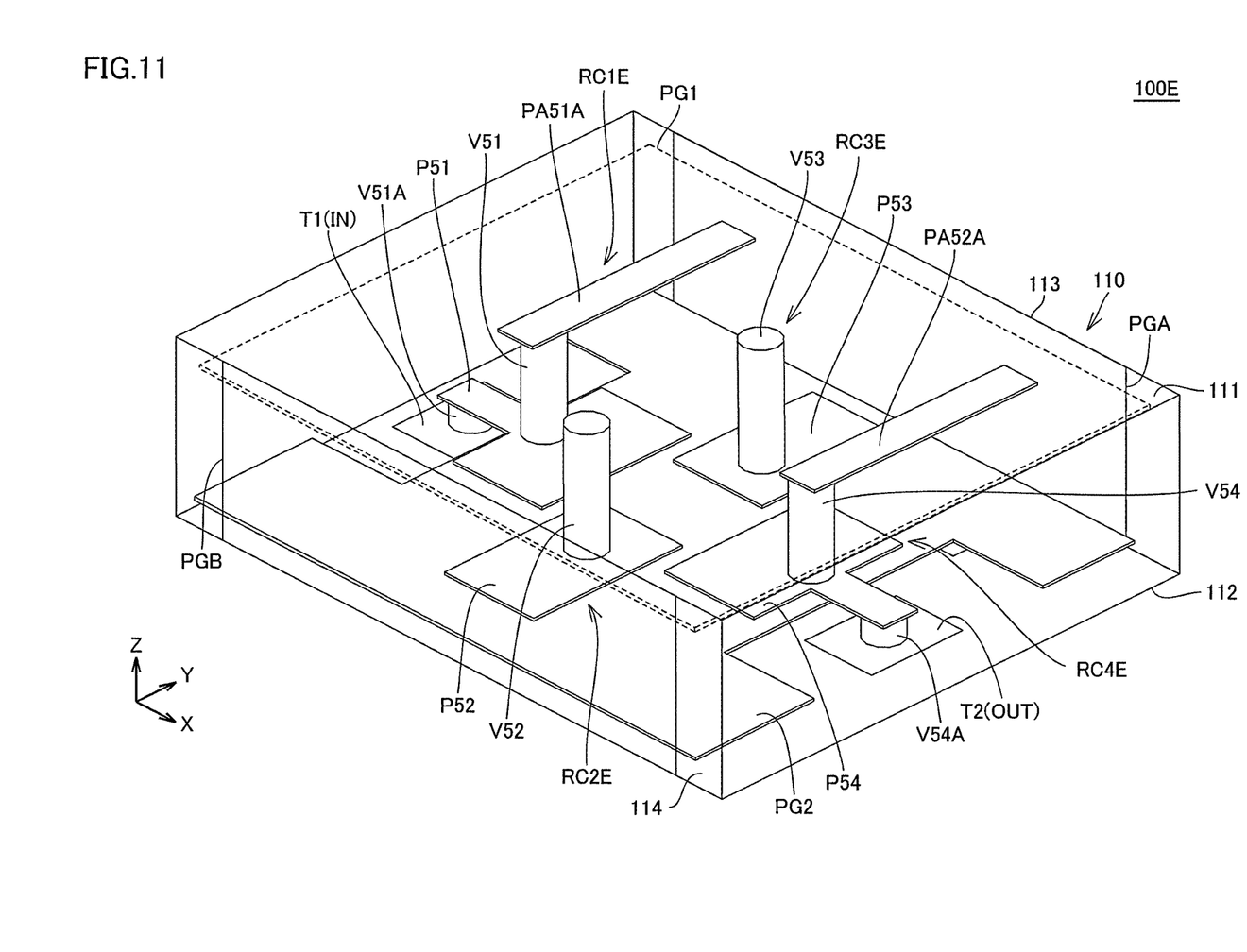
FIG. 11 is a perspective transparent view of an LC filter according to a third preferred embodiment of the present invention.

FIG. 11 is a perspective transparent view of an LC filter 100E according to the third preferred embodiment. In the LC filter 100E, the plate electrode PG1 and the plate electrode PG2 are connected each other by plate-shaped electrodes provided on side surfaces of the multilayer body 110, instead of the ground vias in the LC filter 100D of the second preferred embodiment. Note that in FIG. 11, elements common to the LC filter 100D of FIG. 10 are not described again.

Referring to FIG. 11, with the LC filter 100E, a plate-shaped side surface electrode PGA is provided on the side surface 113 of the multilayer body and a plate-shaped side surface electrode PGB is provided on the side surface 114. The side surface electrodes PGA, PGB are connected with end surfaces of the plate electrodes PG1, PG2.

The inductor via V51 connected to the input terminal T1 is connected with the side surface electrode PGA by a wiring electrode PA51A. The inductor via V54 connected to the output terminal T2 is connected with the side surface electrode PGA by a wiring electrode PA52A. Each of the wiring electrodes PA51A, PA52A is provided on a dielectric layer between the plate electrode PG1 and the plate electrode PG2 and is connected at a position on the side surface electrode PGA between the plate electrode PG1 and the plate electrode PG2. As a result, an LC resonance circuit (a first resonance circuit RC1E) directly connected with a ground via is defined by the inductor via V51, the capacitor electrode P51, and the wiring electrode PA51A. Likewise, an LC resonance circuit (a fourth resonance circuit RC4E) directly connected with a ground via is defined by the inductor via V54, the capacitor electrode P54, and a wiring electrode PA54A. A configuration is also possible in which one or both of the wiring electrodes PA51A, PA52A is/are connected to the side surface electrode PGB instead of the side surface electrode PGA.

A high frequency signal supplied to the input terminal T1 is transferred by way of the first resonance circuit RC1E, a second resonance circuit RC2E defined by the inductor via V52 and the capacitor electrode P52, a third resonance circuit RC3E defined by the inductor via V53 and the capacitor electrode P53, and the fourth resonance circuit RC4E, to be output from the output terminal T2.

In this manner, the multi-stage LC filter 100E including a configuration in which the plate electrodes PG1, PG2 are connected each other by the side surface electrodes PGA, PGB in place of the ground vias is configured such that the first resonance circuit RC1E and the fourth resonance circuit RC4E connected to the input and output terminals are directly connected with the ground vias. Thus, the degree of coupling between the resonance circuits is reduced while reducing or preventing decrease in the Q value of the entire filter in the LC filter 100E as well; hence the attenuation characteristics can be improved while reducing or preventing decrease in the insertion loss of the filter.

The "side surface electrodes PGA, PGB" in the third preferred embodiment collectively correspond to the "connection electrodes".

The presently disclosed preferred embodiments should be considered to be illustrative and not limitative in all respects. The scope of the present disclosure is indicated not by the description of the preferred embodiments above but by the claims, and all the modifications within meaning and scope equivalent to the claims are intended to be encompassed.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An LC filter comprising:
an input terminal;
an output terminal;
a multilayer body including a plurality of dielectric layers;
a first electrode and a second electrode provided on different dielectric layers of the plurality of dielectric layers from each other in the multilayer body;
connection electrodes connecting the first electrode and the second electrode;
a first capacitor electrode, a second capacitor electrode, a third capacitor electrode, and a fourth capacitor electrode each opposing the second electrode;
a first inductor via connected with the first capacitor electrode;
a second inductor via connected with the second capacitor electrode;
a third inductor via connected with the third capacitor electrode; and
a fourth inductor via connected with the fourth capacitor electrode; wherein
one end of the first inductor via is connected with the input terminal with the first capacitor electrode interposed therebetween;
another end of the first inductor via is connected at a position on one of the connection electrodes between the first electrode and the second electrode;
the second inductor via is connected between the first electrode and the second capacitor electrode;
the third inductor via is connected between the first electrode and the third capacitor electrode;
one end of the fourth inductor via is connected with the output terminal with the fourth capacitor electrode interposed therebetween; and
another end of the fourth inductor via is connected at a position on one of the connection electrodes between the first electrode and the second electrode.

2. The LC filter according to claim 1, further comprising:
a ground terminal; wherein
the first electrode and the second electrode are connected with the ground terminal;
the multilayer body is provided in a rectangular parallelepiped including a first side surface and a second side surface opposite each other;
the connection electrodes include a first ground via and a second ground via extending in a layering direction of the multilayer body; and
when viewed in plan from the layering direction of the multilayer body:
the first ground via and the third inductor via are located along the first side surface; and
the second ground via and the second inductor via are located along the second side surface.

3. The LC filter according to claim 2, wherein when viewed in plan from the layering direction of the multilayer body, a first imaginary line connecting the second inductor via and the third inductor via intersects with a second imaginary line connecting the first ground via and the second ground via.

4. The LC filter according to claim 3, wherein the second imaginary line intersects with the first imaginary line at a midpoint of the first imaginary line.

5. The LC filter according to claim 4, wherein the second imaginary line intersects with the first imaginary line at a midpoint of the second imaginary line.

6. The LC filter according to claim 2, further comprising:
a fifth capacitor electrode opposing the second electrode; and
a fifth inductor via located along the second side surface and connected with the first electrode and the fifth capacitor electrode; wherein
when viewed in plan from the layering direction of the multilayer body:
the connection electrodes further include a third ground via located along the first side surface and connecting the first electrode and the second electrode;
the second ground via is located between the second inductor via and the fifth inductor via; and
the third inductor via is located between the first ground via and the third ground via.

7. The LC filter according to claim 6, wherein the first ground via and the third ground via are located adjacent to a first side surface of the multilayer body and the second ground via is located adjacent to a second side surface of the multilayer body which is opposite to the first side surface.

8. The LC filter according to claim 6, wherein the first through third ground vias are located on two sides of signal transfer paths between respective ones of the first through third inductor vias.

9. The LC filter according to claim 6, wherein the first through third ground vias and the first through third inductor vias are arranged symmetrically within the multilayer body.

10. The LC filter according to claim 2, further comprising:
a fourth ground via and a fifth ground via that connect the first electrode and the second electrode; wherein
when viewed in plan from the layering direction of the multilayer body:
the third inductor via is located between the first ground via and the fourth ground via along the first side surface; and
the second inductor via is located between the second ground via and the fifth ground via along the second side surface.

11. The LC filter according to claim 10, wherein the first through fifth ground vias are located on two sides of signal transfer paths between respective ones of the first through fifth inductor vias.

12. The LC filter according to claim 2, wherein at least one of the first ground via and the second ground via are located at a corner of the multilayer body.

13. The LC filter according to claim 1, wherein the first capacitor electrode, the second capacitor electrode, the third capacitor electrode, and the fourth capacitor electrode each define capacitances together with the second electrode.

14. The LC filter according to claim 1, wherein
the multilayer body is a rectangular parallelepiped including a first side surface and a second side surface opposite each other; and
the connection electrodes are plate-shaped electrodes provided on the first side surface and the second side surface.

15. The LC filter according to claim 1, wherein the multilayer body is made of ceramic.

16. The LC filter according to claim 1, wherein the LC filter is a band pass filter.

* * * * *